US009978456B2

(12) United States Patent
Khandelwal et al.

(10) Patent No.: US 9,978,456 B2
(45) Date of Patent: May 22, 2018

(54) TECHNIQUES FOR REDUCING READ DISTURB IN PARTIALLY WRITTEN BLOCKS OF NON-VOLATILE MEMORY

(71) Applicant: SanDisk Technologies LLC, Plano, TX (US)

(72) Inventors: Anubhav Khandelwal, Mountain View, CA (US); Dana Lee, Saratoga, CA (US); Abhijeet Manohar, Karnataka (IN); Henry Chin, Fremont, CA (US); Gautam Dusija, Milpitas, CA (US); Daniel Tuers, Kapaa, HI (US); Chris Avila, Saratoga, CA (US); Cynthia Hsu, Fremont, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days. days.

(21) Appl. No.: 14/543,660

(22) Filed: Nov. 17, 2014

(65) Prior Publication Data

US 2016/0141046 A1 May 19, 2016

(51) Int. Cl.
*G11C 16/34* (2006.01)
*G11C 11/56* (2006.01)
(Continued)

(52) U.S. Cl.
CPC ...... *G11C 16/3427* (2013.01); *G11C 11/5628* (2013.01); *G11C 11/5642* (2013.01); (Continued)

(58) Field of Classification Search
CPC ............ G11C 16/3427; G11C 11/5628; G11C 11/5642
See application file for complete search history.

(56) References Cited

U.S. PATENT DOCUMENTS 4,139,911 A 2/1979 Sciulli et al.
4,218,764 A 8/1980 Furuta et al.
(Continued)

FOREIGN PATENT DOCUMENTS

EP 97460009 2/1997
EP 0791933 8/1997
(Continued)

OTHER PUBLICATIONS

Lee et al., "Error Correction Technique for Multivalued MOS Memory," *Electronic Letters*, vol. 27, No. 15, Jul. 18, 1991, pp. 1321-1323.

(Continued)

*Primary Examiner* — J. H. Hur
(74) *Attorney, Agent, or Firm* — Stoel Rives LLP

(57) ABSTRACT

Techniques are presented to reduce the amount of read disturb on partially written blocks of NAND type non-volatile memory, both for when determining the last written word line in a block and also for data read. In both cases, non-selected word lines that are unwritten or, in the case of finding the last written word line, may be unwritten are biased with a lower read-pass voltage then is typically used. The result of such reads can also be applied to an algorithm for finding the last written word by skipping a varying number of word lines. Performance in a last written page determination can also be improved by use of shorter bit line settling times than for a standard read.

28 Claims, 14 Drawing Sheets

| | WL# | Bias | Bias | Bias |
|---|---|---|---|---|
| | 64 | VREAD_PARTIAL | VREAD_PARTIAL | VREAD_PARTIAL |
| | // | VREAD_PARTIAL | VREAD_PARTIAL | VREAD_PARTIAL |
| | WL_i+2 | VREAD_PARTIAL | VREAD_PARTIAL | VREAD_PARTIAL |
| | WL_i+1 | VREAD_PARTIAL | VREAD_PARTIAL | VCG_R |
| Last Written WL | WL_i | VREAD_PARTIAL | VREAD_PARTIAL | VREAD |
| | WL_i-1 | VREAD_PARTIAL | VREAD_PARTIAL | VREAD |
| | // | VREAD_PARTIAL | VREAD_PARTIAL | VREAD |
| | WL_n+1 | VREAD_PARTIAL | VREAD_PARTIAL | VREAD |
| | WL_n | VREAD_PARTIAL | VCG_R | VREAD |
| | WL_n-1 | VREAD_PARTIAL | VREAD | VREAD |
| | // | VREAD_PARTIAL | VREAD | VREAD |
| | 0 | VCG_R | VREAD | VREAD |

Start 1601
Read WL_n = WL_0 with VREAD_PARTIAL = VREAD_PARTIAL_VRB 1603
Compare WL_n Read with "ALL FF". Criteria > 16 Bits ? 1605
No → n = n+4 1609
Yes → n = n+8 1607
Read WL_n with VREAD_PARTIAL = VREAD_PARTIAL_VRA 1611
Compare WL_n Read with "ALL FF". Criteria > 16 Bits ? 1613
Yes / No
n = n+1 1615
Read WL_n with VREAD_PARTIAL = VREAD_PARTIAL_VRA 1617
Compare WL_n Read with "ALL FF". Criteria > 0 Bits ? 1619
Yes / No
Last Written WL = WL_n-1 1621
Finish 1623

(51) Int. Cl.
*G11C 16/04* (2006.01)
*G11C 16/08* (2006.01)
*G11C 16/10* (2006.01)
*G11C 16/26* (2006.01)
*G11C 16/32* (2006.01)

(52) U.S. Cl.
CPC .......... *G11C 16/0483* (2013.01); *G11C 16/08* (2013.01); *G11C 16/10* (2013.01); *G11C 16/26* (2013.01); *G11C 16/32* (2013.01); *G11C 16/3418* (2013.01)

(56) References Cited

U.S. PATENT DOCUMENTS 4,253,059 A 2/1981 Bell et al.
4,460,982 A 7/1984 Gee et al.
4,612,630 A 9/1986 Rosier
4,694,454 A 9/1987 Matsuura
4,703,196 A 10/1987 Arakawa
4,703,453 A 10/1987 Shinoda et al.
4,733,394 A 3/1988 Giebel
4,763,305 A 8/1988 Kuo
4,779,272 A 10/1988 Kohda et al.
4,799,195 A 1/1989 Iwahashi et al.
4,809,231 A 2/1989 Shannon et al.
4,827,450 A 5/1989 Kowalski
4,937,787 A 6/1990 Kobatake
4,962,322 A 10/1990 Chapman
4,964,079 A 10/1990 Devin
4,975,883 A 12/1990 Baker et al.
4,980,859 A 12/1990 Guterman et al.
5,043,940 A 8/1991 Harari
5,052,002 A 9/1991 Tanagawa
5,065,364 A 11/1991 Atwood et al.
5,070,032 A 12/1991 Yuan et al.
5,095,344 A 3/1992 Harari
5,119,330 A 6/1992 Tanagawa
5,122,985 A 6/1992 Santin
5,132,928 A 7/1992 Hayashikoshi et al.
5,132,935 A 7/1992 Ashmore, Jr.
5,151,906 A 9/1992 Sawada
5,157,629 A 10/1992 Sato et al.
5,172,338 A 12/1992 Mehrotra et al.
5,172,339 A 12/1992 Noguchi et al.
5,200,922 A 4/1993 Rao
5,200,959 A 4/1993 Gross et al.
5,239,505 A 8/1993 Fazio et al.
5,262,984 A 11/1993 Noguchi et al.
5,263,032 A 11/1993 Porter et al.
5,270,551 A 12/1993 Kamimura et al.
5,270,979 A 12/1993 Harari et al.
5,278,794 A 1/1994 Tanaka et al.
5,313,421 A 5/1994 Guterman et al.
5,313,427 A 5/1994 Schreck et al.
5,315,541 A 5/1994 Harari et al.
5,321,655 A 6/1994 Iwahashi et al.
5,327,383 A 7/1994 Merchant et al.
5,335,198 A 8/1994 Van Buskirk et al.
5,341,334 A 8/1994 Maruyama
5,343,063 A 8/1994 Yuan et al.
5,347,489 A 9/1994 Mechant et al.
5,365,486 A 11/1994 Schreck
5,377,147 A 12/1994 Merchant et al.
5,394,359 A 2/1995 Kowalski
5,404,485 A 4/1995 Ban
5,450,363 A 9/1995 Christopherson et al.
5,465,236 A 11/1995 Naruke
5,475,693 A 12/1995 Christopherson et al.
5,504,760 A 4/1996 Harari et al.
5,523,972 A 6/1996 Rashid et al.
5,530,705 A 6/1996 Malone, Sr.
5,532,962 A 7/1996 Auclair et al.
5,570,315 A 10/1996 Tanaka et al.
5,583,812 A 12/1996 Harari
5,621,682 A 4/1997 Tanzawa et al.
5,648,934 A 7/1997 O'Toole
5,652,720 A 7/1997 Aulas et al.
5,657,332 A 8/1997 Auclair et al.
5,661,053 A 8/1997 Yuan
5,675,537 A 10/1997 Bill et al.
5,689,465 A 11/1997 Sukegawa et al.
5,699,297 A 12/1997 Yamazaki et al.
5,703,506 A 12/1997 Shook et al.
5,712,815 A 1/1998 Bill et al.
5,715,193 A 2/1998 Norman
5,717,632 A 2/1998 Richart et al.
5,751,639 A 5/1998 Ohsawa
5,761,125 A 6/1998 Himeno
5,774,397 A 6/1998 Endoh et al.
5,798,968 A 8/1998 Lee et al.
5,835,413 A 11/1998 Hurter et al.
5,889,698 A 3/1999 Miwa et al.
5,890,192 A 3/1999 Lee et al.
5,905,673 A 5/1999 Khan
5,909,449 A 6/1999 So et al.
5,930,167 A 7/1999 Lee et al.
5,937,425 A 8/1999 Ban
5,963,473 A 10/1999 Norman
6,046,935 A 4/2000 Takeuchi et al.
6,145,051 A 11/2000 Estakhri et al.
6,151,246 A 11/2000 So et al.
6,199,139 B1 3/2001 Katayama et al.
6,215,697 B1 4/2001 Lu et al.
6,222,762 B1 4/2001 Guterman et al.
6,222,768 B1 4/2001 Hollmer et al.
6,339,546 B1 1/2002 Katayama et al.
6,345,001 B1 2/2002 Mokhlesi
6,415,352 B1 7/2002 Asami et al.
6,426,893 B1 7/2002 Conley et al.
6,456,528 B1 9/2002 Chen
6,522,580 B2 2/2003 Chen et al.
6,560,152 B1 5/2003 Cernea
6,567,307 B1 5/2003 Estakhri
6,678,785 B2 1/2004 Lasser
6,728,134 B2 4/2004 Ooishi
6,760,255 B2 7/2004 Conley et al.
6,763,424 B2 7/2004 Conley
6,771,530 B2 8/2004 Kato et al.
6,772,274 B1 8/2004 Estakhri
6,807,101 B2 10/2004 Ooishi et al.
6,839,281 B2 1/2005 Chen et al.
6,912,160 B2 6/2005 Yamada
6,925,007 B2 8/2005 Harari et al.
6,963,505 B2 11/2005 Cohen
7,012,835 B2 3/2006 Gonzalez et al.
7,076,598 B2 7/2006 Wang
7,224,607 B2 5/2007 Gonzalez et al.
7,224,611 B2 5/2007 Yamamoto et al.
7,242,618 B2 7/2007 Shappir et al.
7,254,071 B2 8/2007 Tu et al.
7,257,025 B2 8/2007 Maayan et al.
7,286,412 B1 10/2007 Chen
7,330,376 B1 2/2008 Chen et al.
7,440,327 B1 * 10/2008 Sekar ................ G11C 16/3418
365/185.17
7,450,425 B2 11/2008 Aritome
7,489,549 B2 2/2009 Mokhlesi
7,518,919 B2 4/2009 Gonzalez et al.
7,613,043 B2 11/2009 Cornwell et al.
7,630,254 B2 12/2009 Lutze
7,631,245 B2 12/2009 Lasser
7,716,538 B2 5/2010 Gonzalez et al.
7,835,209 B2 11/2010 Park et al.
7,843,727 B2 11/2010 Cho et al.
8,014,201 B2 9/2011 Park
8,259,506 B1 9/2012 Sommer et al.
2002/0048202 A1 4/2002 Higuchi
2003/0002348 A1 * 1/2003 Chen .................. G11C 11/5621
365/189.15
2003/0086293 A1 5/2003 Gongwer et al.
2003/0109093 A1 6/2003 Harari et al.
2005/0073884 A1 4/2005 Gonzalez et al.
2005/0231999 A1 10/2005 Moriyama
2006/0039196 A1 2/2006 Gorobets et al.

(56) References Cited

U.S. PATENT DOCUMENTS

2006/0062048 A1 3/2006 Gonzalez et al.
2006/0233023 A1 10/2006 Lin et al.
2007/0174740 A1 7/2007 Kanno
2007/0211532 A1 9/2007 Gonzalez et al.
2007/0279985 A1* 12/2007 Hemink .............. G11C 11/5628 365/185.17
2007/0279989 A1 12/2007 Aritome
2008/0071511 A1 3/2008 Lin
2008/0123420 A1 5/2008 Brandman et al.
2008/0158968 A1 7/2008 Moogat et al.
2008/0158969 A1 7/2008 Moogat et al.
2009/0003058 A1 1/2009 Kang
2009/0187785 A1 7/2009 Gonzalez et al.
2013/0073786 A1* 3/2013 Belgal ................. G06F 12/0246 711/103
2014/0003147 A1* 1/2014 Dutta .................. G11C 11/5635 365/185.11
2014/0247663 A1 9/2014 Yuan et al.
2015/0380095 A1* 12/2015 Wakchaure ............ G11C 16/26 365/185.12

FOREIGN PATENT DOCUMENTS

GB 2289779 11/1995
JP 8-077785 3/1996
JP 8-147988 6/1996
JP 8-279295 10/1996
JP 8-297987 11/1996
JP 09-128165 5/1997
JP 9-306182 11/1997
JP 2000-187992 7/2000
JP 2002-318729 10/2002
JP 2003-058432 2/2003
WO WO 9012400 10/1999
WO WO 01/008015 2/2001
WO WO 01/22232 3/2001
WO WO 02/058074 7/2002
WO WO2005/036401 4/2005
WO WO2005/041107 5/2005
WO WO 2011/024015 3/2011

OTHER PUBLICATIONS

U.S. Appl. No. 13/925,662 entitled High Capacity Select Switches for Three-Dimensional Structures, filed Jun. 24, 2013, 37 pages.

U.S. Appl. No. 14/526,870 entitled “Read Scrub With Adaptive Counter Management”, filed Oct. 29, 2014, 49 pages.

* cited by examiner

Programming into four states represented by a 2-bit code

| | WL# | Bias | Bias | Bias |
|---|---|---|---|---|
| | 64 | VREAD_PARTIAL | VREAD_PARTIAL | VREAD_PARTIAL |
| | // | VREAD_PARTIAL | VREAD_PARTIAL | VREAD_PARTIAL |
| | WL_i+2 | VREAD_PARTIAL | VREAD_PARTIAL | VREAD_PARTIAL |
| | WL_i+1 | VREAD_PARTIAL | VREAD_PARTIAL | VCG_R |
| Last Written WL | WL_i | VREAD_PARTIAL | VREAD_PARTIAL | VREAD |
| | WL_i-1 | VREAD_PARTIAL | VREAD_PARTIAL | VREAD |
| | // | VREAD_PARTIAL | VREAD_PARTIAL | VREAD |
| | WL_n+1 | VREAD_PARTIAL | VREAD_PARTIAL | VREAD |
| | WL_n | VREAD_PARTIAL | VCG_R | VREAD |
| | WL_n-1 | VREAD_PARTIAL | VREAD | VREAD |
| | // | VREAD_PARTIAL | VREAD | VREAD |
| | 0 | VCG_R | VREAD | VREAD |

*FIG. 13*

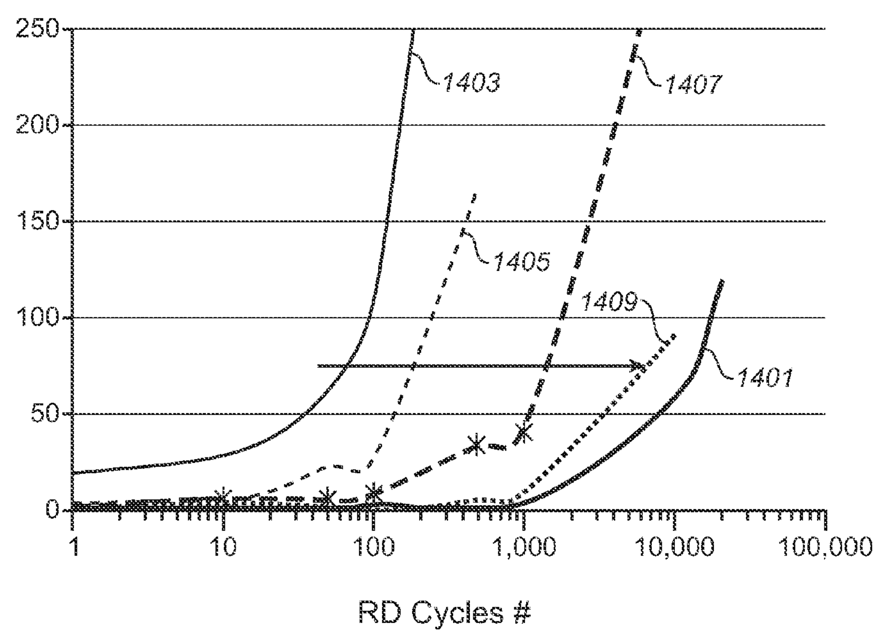

*FIG. 14*

TECHNIQUES FOR REDUCING READ DISTURB IN PARTIALLY WRITTEN BLOCKS OF NON-VOLATILE MEMORY

BACKGROUND

The following relates to the operation of re-programmable non-volatile memory systems such as semiconductor flash memory that record data using charge stored in charge storage elements of memory cells.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page are read or programmed together.

Nonvolatile memory devices are also manufactured from memory cells with a dielectric layer for storing charge. Instead of the conductive floating gate elements described earlier, a dielectric layer is used. An ONO dielectric layer extends across the channel between source and drain diffusions. The charge for one data bit is localized in the dielectric layer adjacent to the drain, and the charge for the other data bit is localized in the dielectric layer adjacent to the source. For example, a nonvolatile memory cell may have a trapping dielectric sandwiched between two silicon dioxide layers. Multi-state data storage is implemented by separately reading the binary states of the spatially separated charge storage regions within the dielectric.

SUMMARY

For a non-volatile memory having a plurality of blocks formed according to a NAND type architecture in which memory cells of a block are formed along multiple word lines, and in which the word lines of a block are written sequentially from a first end to a second end, a method is present to determine the last written word line in a partially written block. A sensing operation is performed on a first word line of the partially written block, where the sensing operation includes: applying a first sensing voltage along the first word line; applying a first non-selected word line read voltage along word lines between the first word line and the first end of the partially written block; and applying a second non-selected word line read voltage along one or more word lines between the first word line and the second end of the partially written block. The first non-selected word line read voltage is sufficient to allow the memory cells to conduct independently of their data state programmed and the second non-selected word line read voltage is less than the first non-selected word line read voltage. Based on the result of the sensing operation on the first word line, it is determined whether the first word line has been written.

In a non-volatile memory having a plurality of blocks formed according to a NAND type architecture in which memory cells of a block are formed along a plurality of word lines, and in which the word lines of a block are written sequentially from a first end to a second end of a block, a method is presented for determining the last written word line in a partially written block. The method includes performing a sensing operation on a first word line of the partially written block and, based on the result of the sensing operation on the first word line, determining whether the first word line has been written. The sensing operation includes: settling a voltage on the bit lines corresponding to the memory cells to be sensed, wherein the settling a voltage as used in the determination of the last written word line uses a shorter settling time than a standard sensing operation; and subsequently applying a first sensing voltage along the first word line.

A method is described to perform a read operation of a non-volatile memory system, where the non-volatile memory system includes an array of non-volatile memory cells having a plurality of blocks formed according to a NAND type architecture in which memory cells of a block are formed along a plurality of word lines, including the first word line, and in which the word lines of a block are written sequentially from a first end to a second end of the block. The method includes determining whether the read operation includes a page of data stored on a first word line that belongs to a partially written block. In response to determining that the first word line belongs to a partially written block, a modified read operation is performed for the first word line. The modified read operation applies a first sensing voltage along the first word line; applies a first non-selected word line read voltage along word lines between the first word line and the first end of the partially written block; and applies a second non-selected word line read voltage along one or more word lines between the first word line and the second end of the partially written block. The first non-selected word line read voltage is sufficient to allow the memory cells to conduct independent of a data state programmed in the cells. The second non-selected word line read voltage is less than the first non-selected word line read voltage.

Various aspects, advantages, features and embodiments are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIG. 13 illustrates using a lowered VREAD_PARTIAL on the drain side of the selected word line when searching for the last written word line of a block.

FIG. 14 shows the use of the lower VREAD_PARTIAL to help to reduce the disturb accumulated on drain side erased word lines, thereby reducing bit error rates.

DETAILED DESCRIPTION

Memory System

Figure 1:
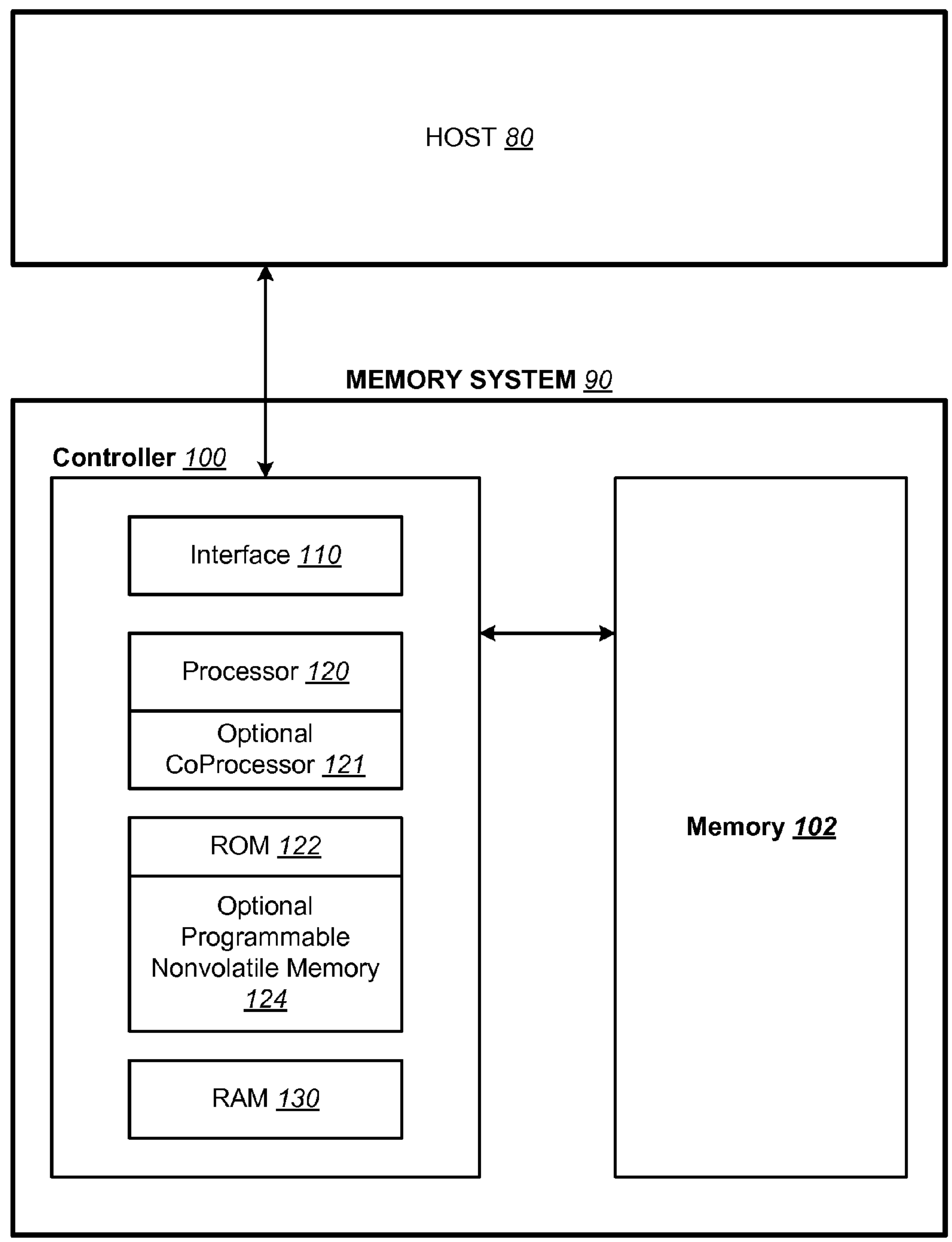
FIG. 1 illustrates schematically the main hardware components of a memory system suitable for implementing various aspects described in the following.

FIG. 1 illustrates schematically the main hardware components of a memory system suitable for implementing the following. The memory system 90 typically operates with a host 80 through a host interface. The memory system may be in the form of a removable memory such as a memory card, or may be in the form of an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application.

With respect to the memory section 102, semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

Figure 2:
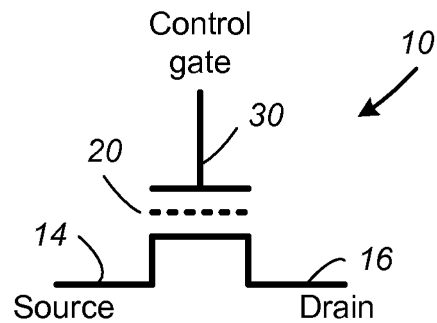
FIG. 2 illustrates schematically a non-volatile memory cell.

It will be recognized that the following is not limited to the two dimensional and three dimensional exemplary structures described but cover all relevant memory structures within the spirit and scope as described herein Physical Memory Structure FIG. 2 illustrates schematically a non-volatile memory cell. The memory cell 10 can be implemented by a field-effect transistor having a charge storage unit 20, such as a floating gate or a charge trapping (dielectric) layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Also, examples of memory devices utilizing dielectric storage elements.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
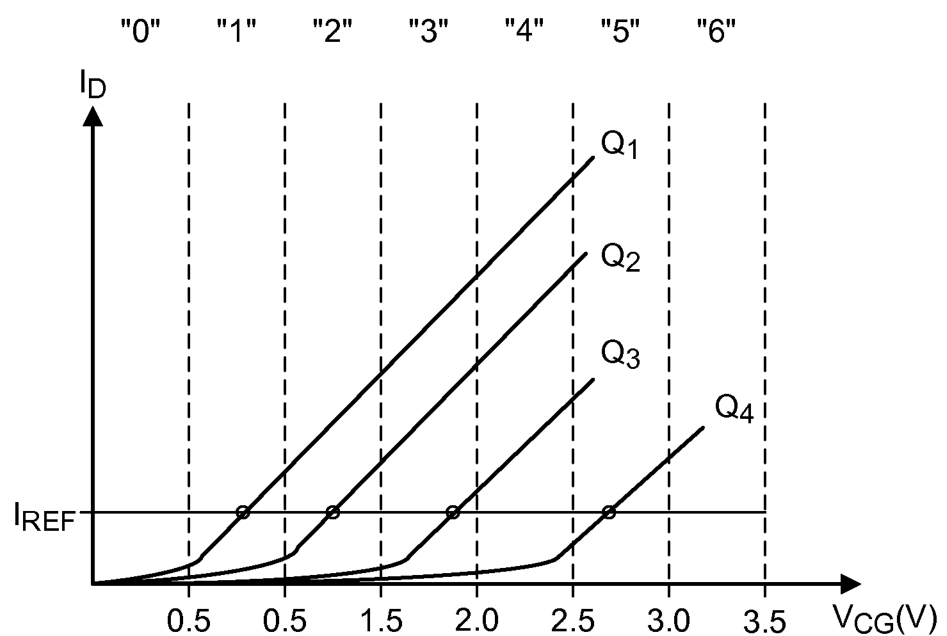
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four of seven possible charge levels that can be programmed on a floating gate of a memory cell, respectively corresponding to four possible memory states. As an example, the threshold voltage window of a population of cells may range from 0.5V to 3.5V. Seven possible programmed memory states "0", "1", "2", "3", "4", "5", "6", and an erased state (not shown) may be demarcated by partitioning the threshold window into regions in intervals of 0.5V each. For example, if a reference current, IREF of 2 μA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4:
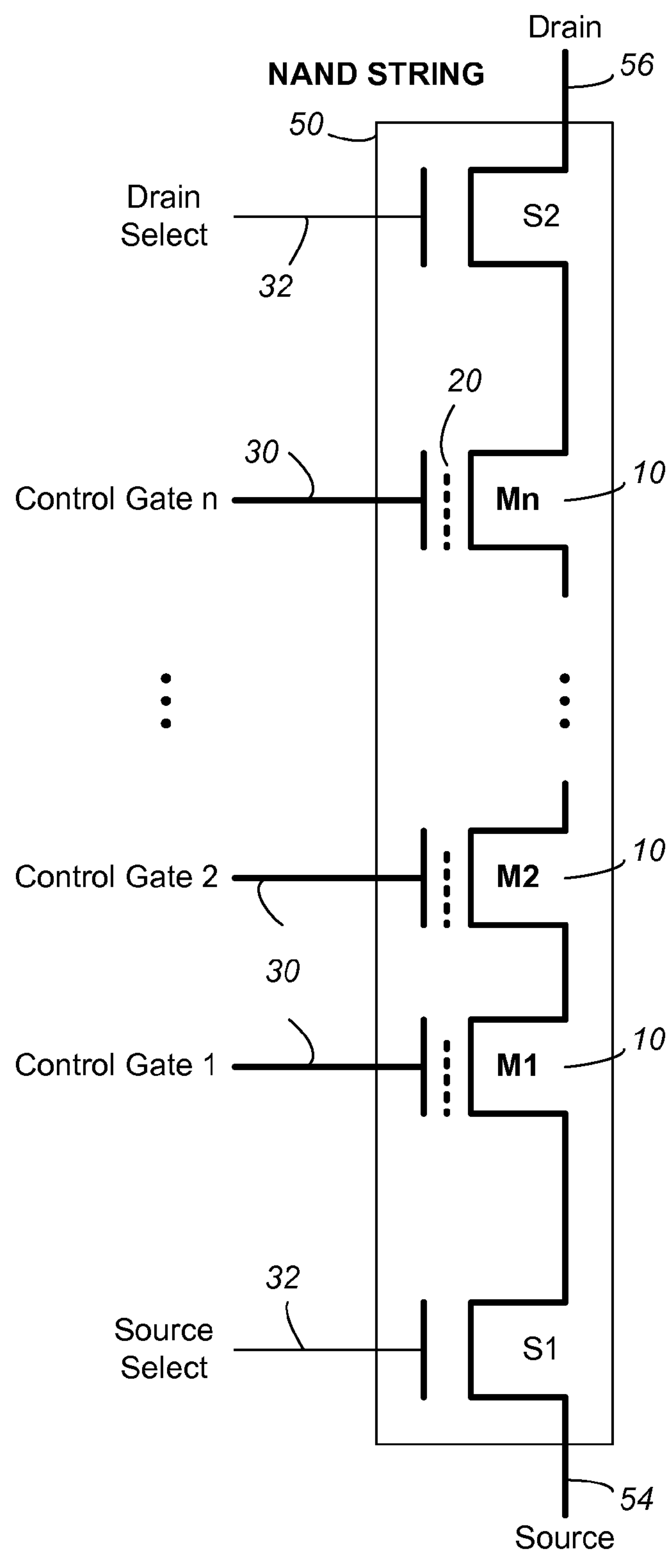
FIG. 4 illustrates schematically a string of memory cells organized into a NAND string.

FIG. 4 illustrates schematically a string of memory cells organized into a NAND string. A NAND string 50 comprises a series of memory transistors M1, M2, . . . Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 5). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 5, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell.

FIG. 4B illustrates an example of a NAND array 210 of memory cells, constituted from NAND strings 50 such as that shown in FIG. 4. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
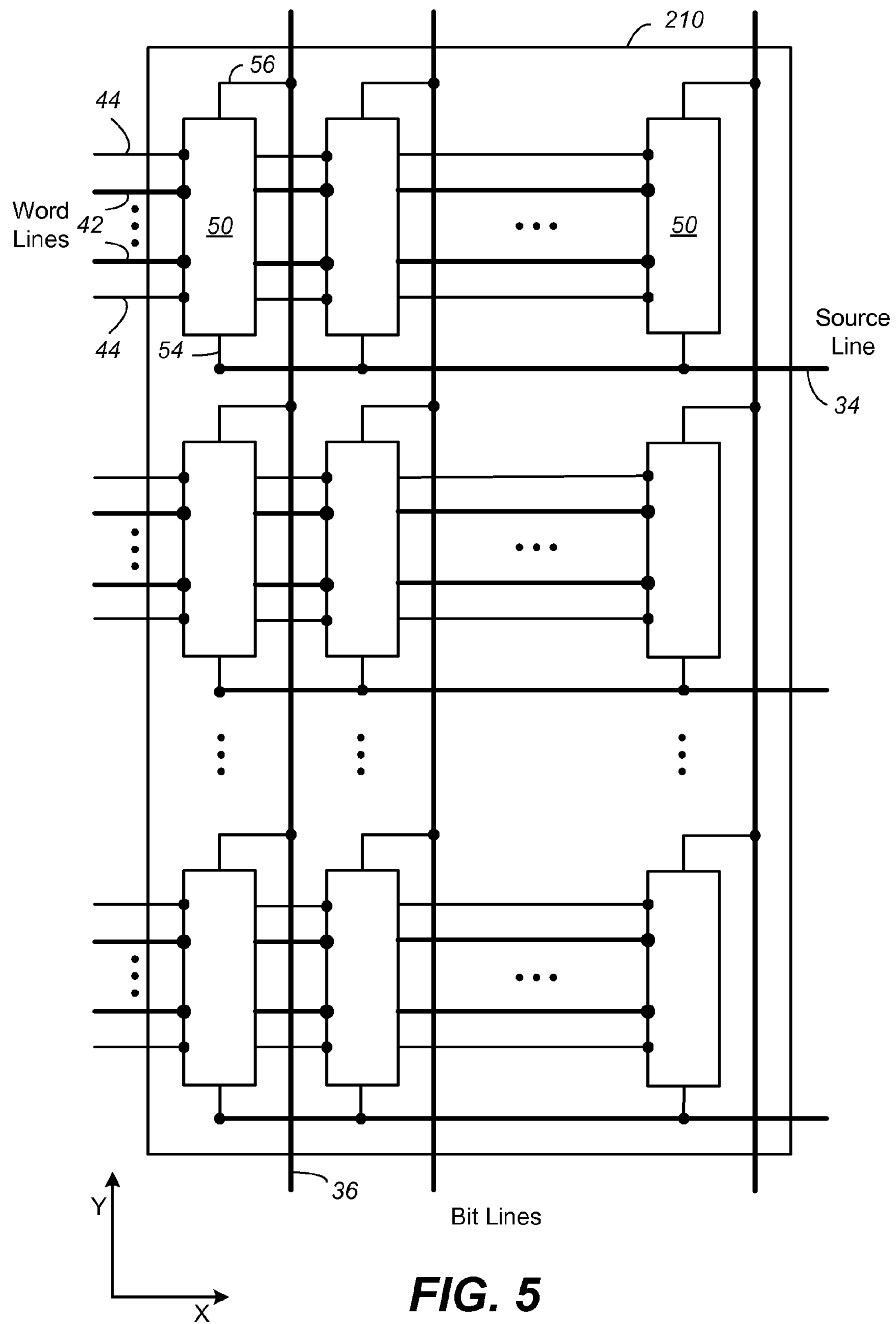
FIG. 5 illustrates an example of a NAND array 210 of memory cells, constituted from NAND strings 50 such as that shown in FIG. 4.
Figure 6:
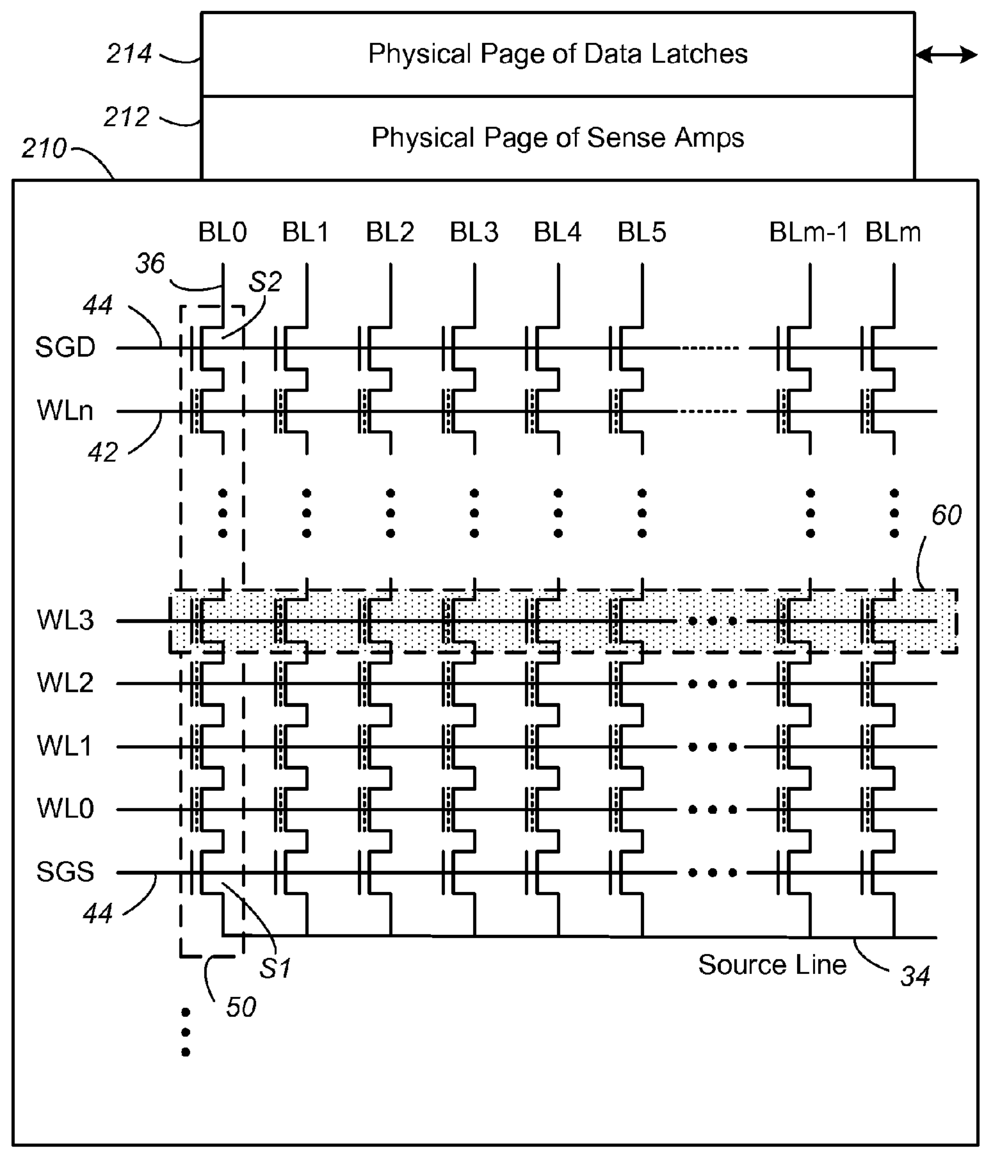
FIG. 6 illustrates a page of memory cells, organized in the NAND configuration, being sensed or programmed in parallel.

FIG. 6 illustrates a page of memory cells, organized in the NAND configuration, being sensed or programmed in parallel. FIG. 6 essentially shows a bank of NAND strings 50 in the memory array 210 of FIG. 5, where the detail of each NAND string is shown explicitly as in FIG. 4. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One difference between flash memory and other of types of memory is that a cell must be programmed from the erased state. That is the floating gate must first be emptied of charge. Programming then adds a desired amount of charge back to the floating gate. It does not support removing a portion of the charge from the floating gate to go from a more programmed state to a lesser one. This means that updated data cannot overwrite existing data and must be written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

All-Bit, Full-Sequence MLC Programming

Figure 7:
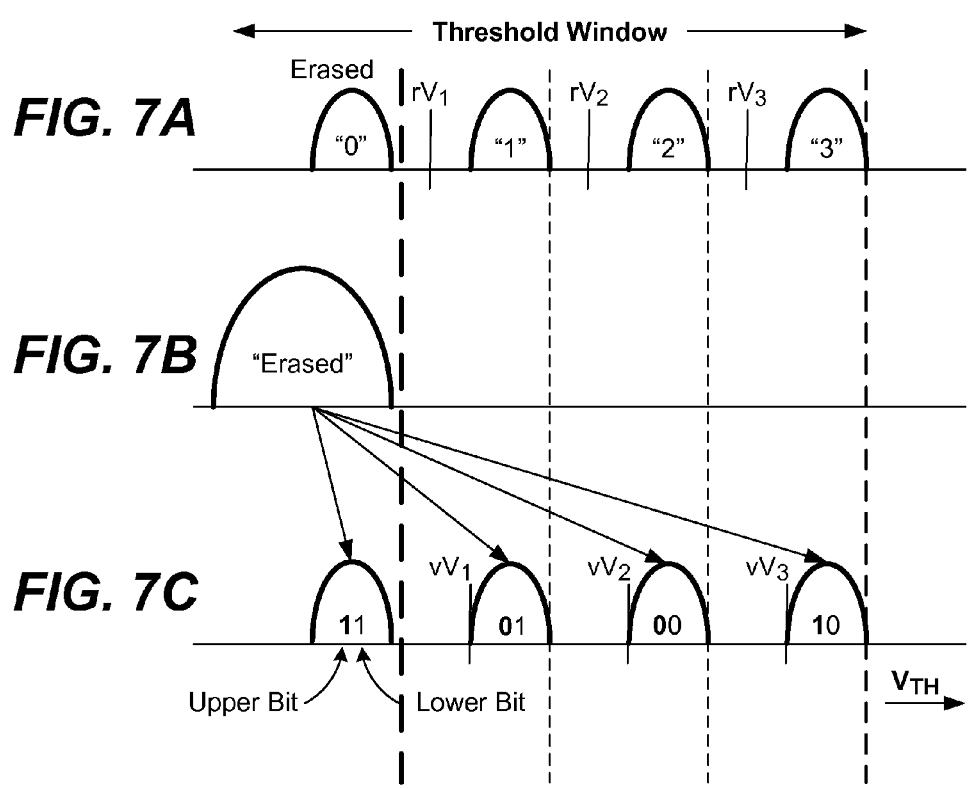
FIGS. 7A-7C illustrate an example of programming a population of memory cells.

FIG. 7A-7C illustrate an example of programming a population of 4-state memory cells. FIG. 7A illustrates the population of memory cells programmable into four distinct distributions of threshold voltages respectively representing memory states "0", "1", "2" and "3". FIG. 7B illustrates the initial distribution of "erased" threshold voltages for an erased memory. FIG. 6C illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "1", "2" and "3" or remain un-programmed in the "erased" state. As the memory gets more programming, the initial distribution of the "erased" state as shown in FIG. 7B will become narrower and the erased state is "0" state.

A 2-bit code having a lower bit and an upper bit can be used to represent each of the four memory states. For example, the “0”, “1”, “2” and “3” states are respectively represented by “11”, “01”, “00” and ‘10”. The 2-bit data may be read from the memory by sensing in “full-sequence” mode where the two bits are sensed together by sensing relative to the read demarcation threshold values $rV_1$, $rV_2$ and $rV_3$ in three sub-passes respectively.

3-D NAND Structures

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings.

Figure 8:
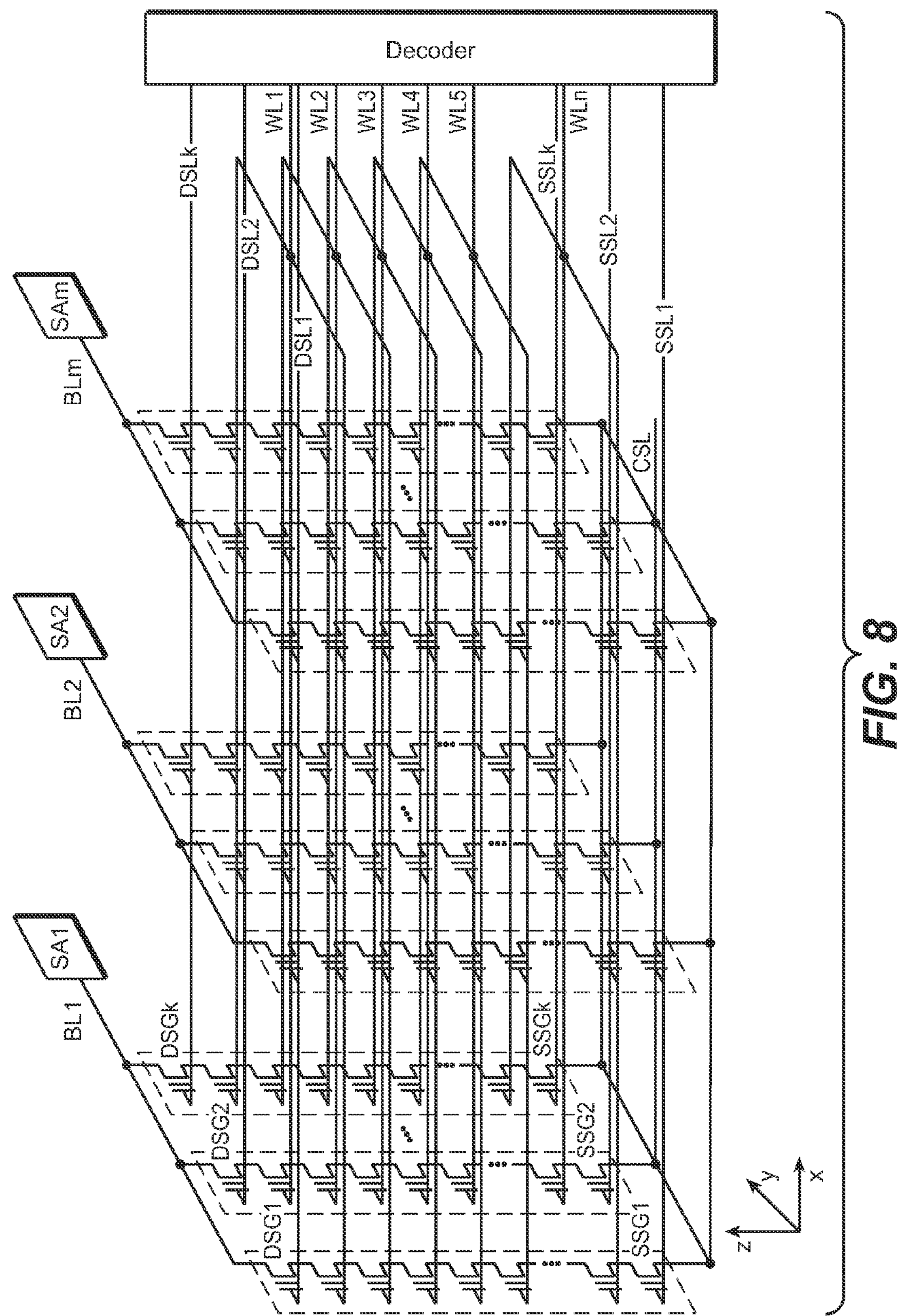
FIG. 8 shows an example of a physical structure of a 3-D NAND string.

FIG. 8 shows a first example of a NAND string 701 that extends in a vertical direction, i.e. extending in the z-direction, perpendicular to the x-y plane of the substrate. Memory cells are formed where a vertical bit line (local bit line) 703 passes through a word line (e.g. WL0, WL1, etc.). A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable local bit line/channel material (with suitable dielectric layers for isolation).

As with planar NAND strings, select gates 705, 707, are located at either end of the string to allow the NAND string to be selectively connected to, or isolated from, external elements 709, 711. Such external elements are generally conductive lines such as common source lines or bit lines that serve large numbers of NAND strings. Vertical NAND strings may be operated in a similar manner to planar NAND strings and both SLC and MLC operation is possible. While FIG. 8 shows an example of a NAND string that has 32 cells (0-31) connected in series, the number of cells in a NAND string may be any suitable number. Not all cells are shown for clarity. It will be understood that additional cells are formed where word lines 3-29 (not shown) intersect the local vertical bit line.

A 3D NAND array can, loosely speaking, be formed tilting up the respective structures 50 and 210 of FIGS. 5 and 6 to be perpendicular to the x-y plane. In this example, each y-z plane corresponds to the page structure of FIG. 6, with m such plane at differing x locations. The (global) bit lines, BL1-*m*, each run across the top to an associated sense amp SA1-*m*. The word lines, WL1-*n*, and source and select lines SSL1-*n* and DSL1-*n*, then run in x direction, with the NAND string connected at bottom to a common source line CSL.

Figure 9:
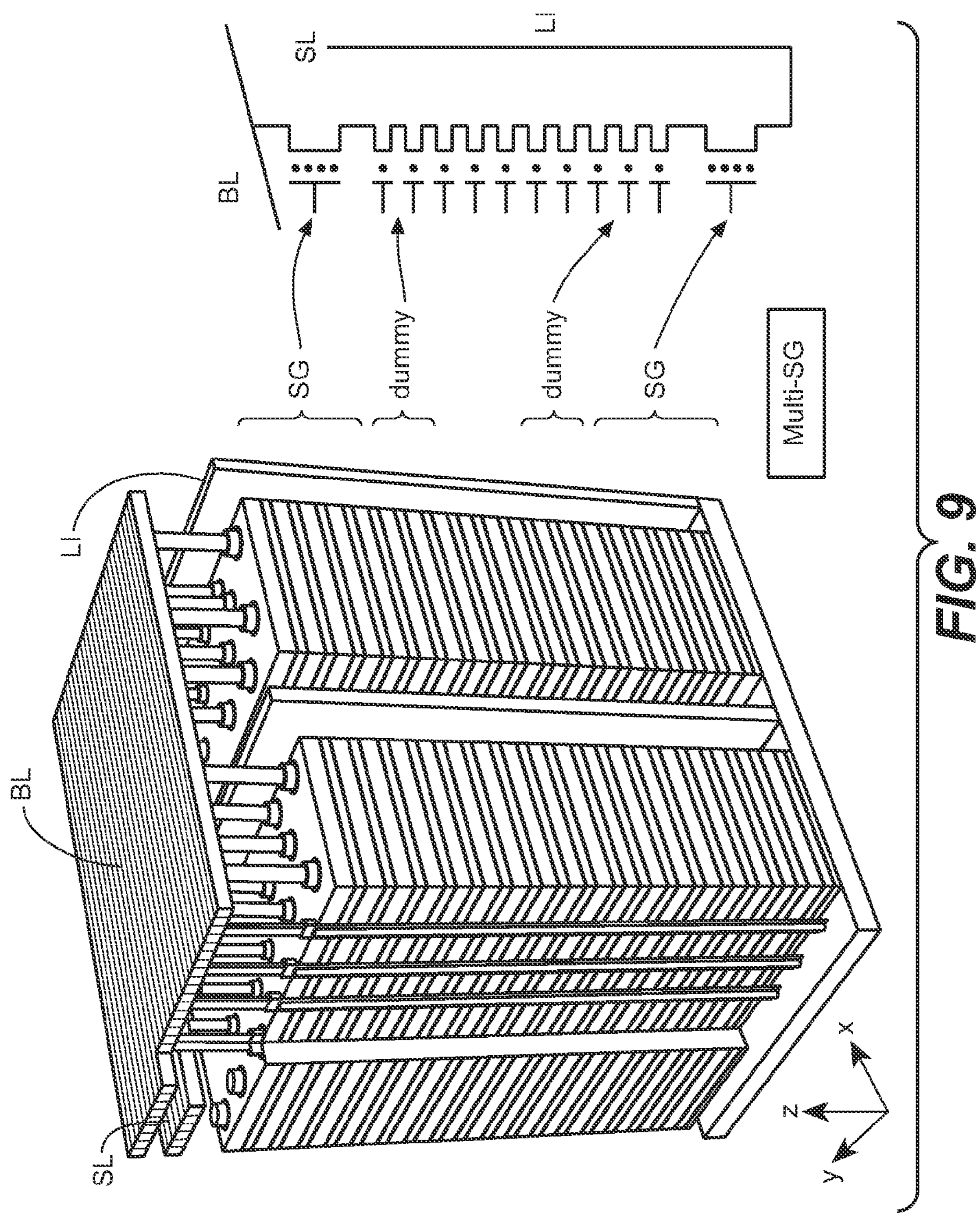
FIGS. 9-12 look at a particular monolithic three dimensional (3D) memory array of the NAND type (more specifically of the "BiCS" type).

FIGS. 9-12 look at a particular monolithic three dimensional (3D) memory array of the NAND type (more specifically of the “BiCS” type), where one or more memory device levels are formed above a single substrate, in more detail. FIG. 9 is an oblique projection of part of such a structure, showing a portion corresponding to two of the page structures in FIG. 5, where, depending on the embodiment, each of these could correspond to a separate block or be different “fingers” of the same block. Here, instead to the NAND strings lying in a common y-z plane, they are squashed together in the y direction, so that the NAND strings are somewhat staggered in the x direction. On the top, the NAND strings are connected along global bit lines (BL) spanning multiple such sub-divisions of the array that run in the x direction. Here, global common source lines (SL) also run across multiple such structures in the x direction and are connect to the sources at the bottoms of the NAND string, which are connected by a local interconnect (LI) that serves as the local common source line of the individual finger. Depending on the embodiment, the global source lines can span the whole, or just a portion, of the array structure. Rather than use the local interconnect (LI), variations can include the NAND string being formed in a U type structure, where part of the string itself runs back up.

To the right of FIG. 9 is a representation of the elements of one of the vertical NAND strings from the structure to the left. Multiple memory cells are connected through a drain select gate SGD to the associated bit line BL at the top and connected through the associated source select gate SDS to the associated local source line LI to a global source line SL. It is often useful to have a select gate with a greater length than that of memory cells, where this can alternately be achieved by having several select gates in series (as described in U.S. patent application Ser. No. 13/925,662, filed on Jun. 24, 2013), making for more uniform processing of layers. Additionally, the select gates are programmable to have their threshold levels adjusted. This exemplary embodiment also includes several dummy cells at the ends that are not used to store user data, as their proximity to the select gates makes them more prone to disturbs.

Figure 10:
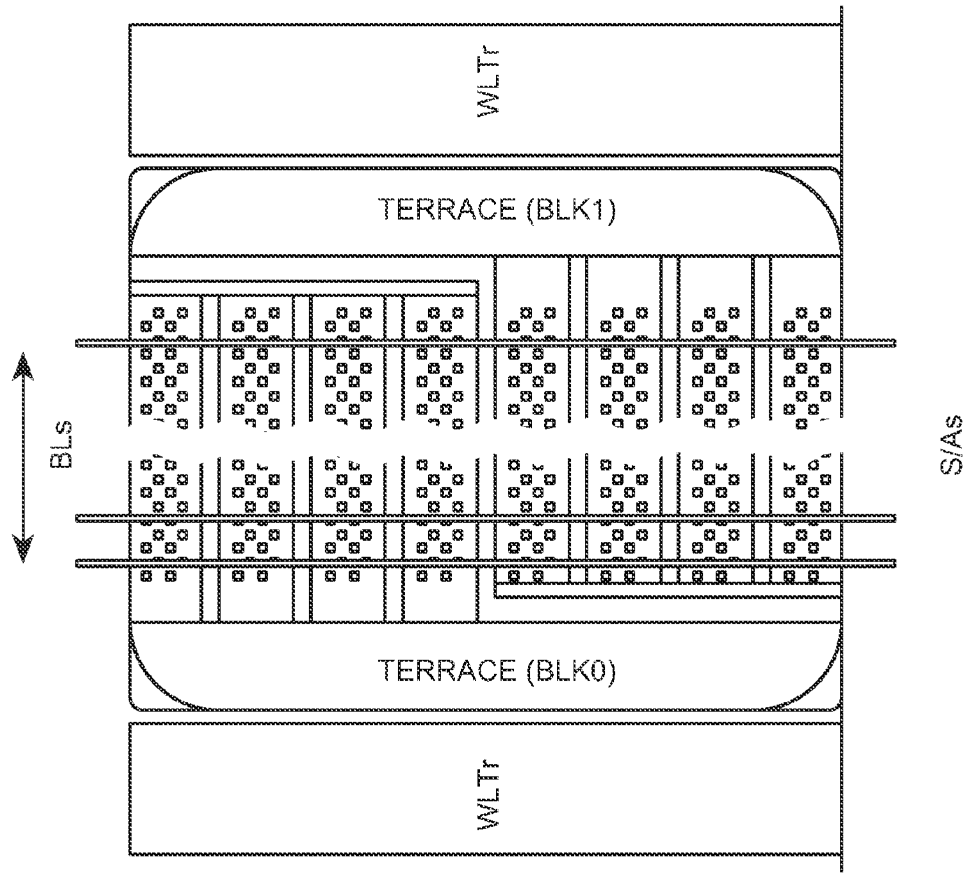

FIG. 10 shows a top view of the structure for two blocks in the exemplary embodiment. Two blocks (BLK0 above, BLK1 below) are shown, each having four fingers that run left to right. The word lines and select gate lines of each level also run left to right, with the word lines of the different fingers of the same block being commonly connected at a “terrace” and then on to receive their various voltage level through the word line select gates at WLTr. The word lines of a given layer in a block can also be commonly connected on the far side from the terrace. The selected gate lines can be individual for each level, rather common, allowing the fingers to be individually selected. The bit lines are shown running up and down the page and connect on to the sense amp circuits, where, depending on the embodiment, each sense amp can correspond to a single bit line or be multiplexed to several bit lines.

Figure 11:
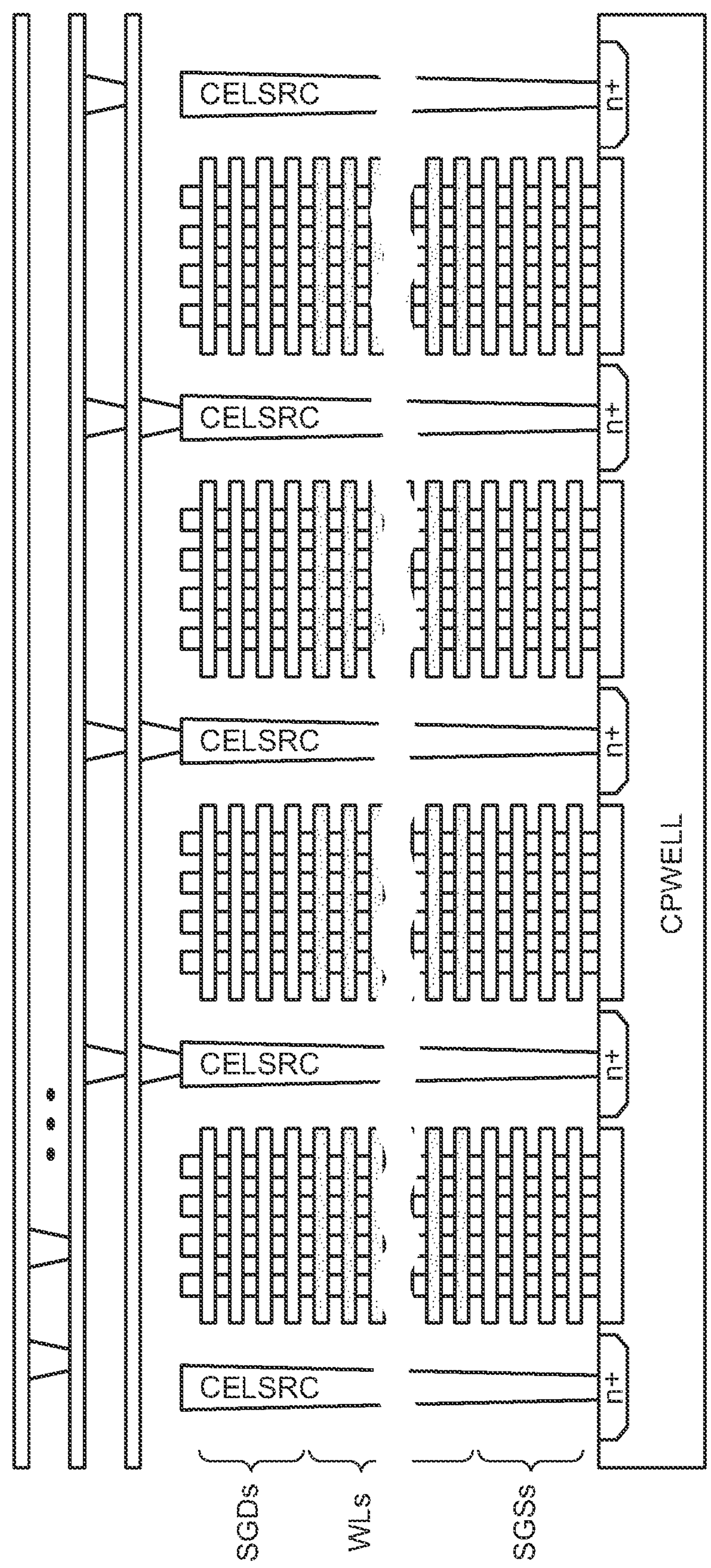

FIG. 11 shows a side view of one block, again with four fingers. In this exemplary embodiment, the select gates SGD and SGS at either end of the NAND strings are formed of four layers, with the word lines WL in-between, all formed over a CPWELL. A given finger is selected by setting its select gates to a level VSG and the word lines are biased according to the operation, such as a read voltage (VCGRV) for the selected word lines and the read-pass voltage (VREAD) for the non-selected word lines. The non-selected fingers can then be cut off by setting their select gates accordingly.

Figure 12:
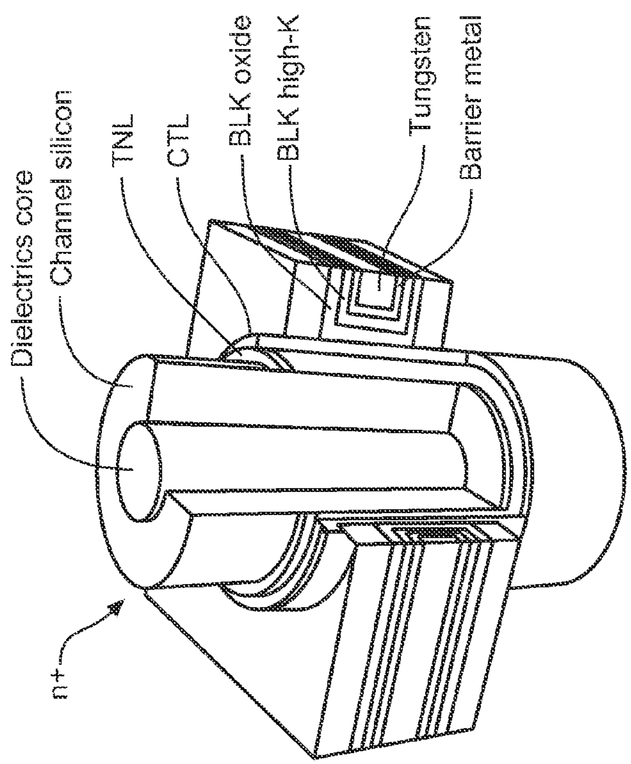

FIG. 12 illustrates some detail of an individual cell. A dielectric core runs in the vertical direction and is surrounded by a channel silicon layer, that is in turn surrounded a tunnel dielectric (TNL) and then the charge trapping dielectric layer (CTL). The gate of the cell is here formed of tungsten with which is surrounded by a metal barrier and is separated from the charge trapping layer by blocking (BLK) oxide and a high K layer.

Reducing Read Disturb in Partially Written Blocks

Performing an operation, such as a read, write or erase, on one location of a memory like those described above can affect the quality of data stored on another location of the memory, an effect called a "disturb". For example, due to capacitive coupling between memory cells on adjacent word line (or "Yupin-effect"), a voltage applied along one word line can affect the state of the memory cells on adjacent word lines. In the case of NAND memory, whether of the 2D or 3D variety, when reading a selected word line, non-selected word lines along shared NAND strings must also be biased. Referring back to FIG. 6, to read memory cells along WL3 requires that the cells along the other word lines be conducting. This is done by applying a voltage VREAD to all non-selected word lines (WL0-2 and WL4-*n* in this example) that is high enough so that non-selected memory cells on these word lines conduct regardless of the data state they hold. For example, for the states illustrated in FIGS. 7A-C, VREAD needs to be higher than the threshold voltages of the highest state's distribution. The cells on these non-selected word lines will then conduct and the cells along selected word lines can then be read by applying a sensing voltage VCG_R (such as one of the sensing voltages, such as $rV_1$, $rV_2$, or $rV_3$ in FIG. 7A) along the selected WL3. The application of this relatively high VREAD level can be a cause of read disturb, particularly for erased memory cells.

Word lines are typically written sequentially starting from one end, such as with the source end with WL0 in FIG. 6, and working through to WLn on the drain side. This section looks at techniques to reduce read disturbs on partially written blocks ("PBRD"), such as would happen when the memory system performs binary scan to find the last written page and for host reads to the block. This sort of binary scan is sometimes known as Last Written Page Detection or Find Last Good Page (LWPD/FLGP). Reads to partial written blocks are governed by host usage. There are multiple occasions when system may need to check for last written page, such as during write abort recovery, power interruption, and so on. Some memory system use a flag that is stored with a graceful power shutdown. In such events the boundary in known and LWPD/FLGP can be avoided, but not on all open blocks (especially the block in which the flag needs to be stored). In the case of ungraceful shutdown, the system needs to scan and identify if there was a power interruption during open block program or during idle time.

One way of doing last written page detection is with a binary scan to search for first page which reads ALL FF (fully erased). The last written page is the one before the first page which reads ALLFF. The scanning algorithm and pattern detection is typically done off-chip with a discrete controller chip. This incurs overhead associated with commands and data transfers. In multi-die systems, the scan times scale with the number of NAND chips per controller and can run into timeout constraints.

During these binary scans, the high bias VREAD is applied on drain side relative to the word lines being read. (In this example, the word lines are written in sequence from the source to the drain side.) The more the number of times last written page detection is done, the more drain side word lines are subjected to the high bias VREAD. As exposure to the high bias VREAD increases, drain side word lines can accumulate significant amount of disturb. Hence, when the system comes back and writes the previously unwritten drain side word lines, high bit error rate (BER) can be seen on drain side word lines. This situation is similar to read disturb on partial written blocks that happens on erased, un-written word lines when reading written word lines several times. In the case of LWPD, the boundary page (last written word line) is not yet known, so that it is not possible to apply methods which have a priori knowledge of the partial block boundary page.

The combination of NAND and the sequential writing of data pages onto word lines leads to a much higher level of read disturb on partially written blocks relative to fully written blocks. The reasons for the high bit error rate (BER) for the partially written block case can be explained by considering the partially written block case relative to the fully written block. In the case of a partially written block, only a few word lines may be written in a block, with the higher word lines in the write sequence still being erased. Some of the written word lines are read multiple times, with the higher word lines, that are erased, seeing the high VREAD bias that causes accumulated disturb. When the system comes back and writes the remaining word lines of the block higher word lines see read disturb followed by Yupin-effect word line to word line capacitive coupling during programming. For the fully written case, were all of the word lines have been written, some of the written word lines may also be read multiple times; but for the higher word lines that are already written, they see the high VREAD after Yupin-effect in the write process.

The higher BER is seen for the partially written block case since the higher, unwritten word lines see the read disturb first, while still erased, followed by the Yupin-effect during the subsequent write. (More detail on, and techniques related to, error arising from partial block reads is discussed in U.S. patent application Ser. No. 14/526,870 filed on Oct. 29, 2014.) For the fully written block, the latter word lines see the program related Yupin-effect first, followed by the read disturb. Since the amount of disturb is independent of initial erase depth, the erased state shifts up more when Yupin-effect is seen after disturb, i.e. for partial block case, resulting in a high BER. As a consequence, when doing binary search for last written page detection or reading data from the written pages, the system can expect a high BER on erased/un-written word lines after the whole block is written.

As noted above, one way to find the last written page of a block is to perform a binary search of the block's word lines, a technique that can lead to a large number of reads, and corresponding bit error rates, on partially written blocks. To reduce the bit error rate, the following describes the use of a reduced VREAD level for some of the non-selected word lines, a technique that can be extended to data reads. When doing a last written page search, the reduced VREAD technique can also be used to intelligently skip word lines when searching through a block from one end to the other. Further, to improve performance during a last written page search, whether in a binary search or when searching from the end, reduced settling times can be used.

To determine the last written of a sequentially written set of word line, it is not necessarily provide an accurate read of the data along the word line, but just to determine whether it has been written or is still in an erased state. The described techniques can be implemented as an on-chip, auto-scan feature for last written page detection. When performing the sensing operation, a lower VREAD (or VREAD_PARTIAL) is applied to drain side word lines (that is, the word lines written latter in the write sequence order). The sensing operation with the reduced VREAD_PARTIAL can also be used to determine how many word lines to skip in the process based on how may bits are read as a "1".

Considering these in turn and looking at the lowered VREAD level, in a standard sensing operation for a NAND type memory the non-selected word lines need to biased to a level that allows them to conduct for any programmed data state; however, for an unwritten word line, the erased memory cells will turn on at a lower voltage, the using of which will result less disturb on the unprogrammed cells. Consequently, when searching for the last written word line, when performing a read some or all of the word lines later in the write order than the word can have applied the lower VREAD_PARTIAL; using the example where word lines are written in order from the source end of the NAND strings, VREAD_PARTIAL can be applied to all word lines on the drain side of the selected word line. This can be illustrated with respect to FIG. 13.

The left-most column in FIG. 13 shows the word line numbers, where these are numbered in the sequential order in which they are written, starting in this example with WL0 on the source side and working toward WL64 on the drain/bit line end. The last written word line is here taken to be WL_i. In the read of the left "Bias", WL0 selected and all the other word line receive the VREAD_PARTIAL level. As the word lines from WL1 to WL_i are written, some cells along these word lines may not conduct for VREAD_PARTIAL so that this modified sensing operation may not yield an accurate data read, yielding a false "1", but it will allow a determination of whether WL0 has been written. Similarly, for a word line WL_n as shown in the middle "Bias" column, the word lines on the source side (WL0 to WL_n−1) need to not contribute and are set at the full VREAD, while the (potentially unwritten) WL_n+1 to WL64 are set at VREAD_PARTIAL. The process would be done similarly, with similar results, for all word lines up to and including the last written word line WL_i, the only difference being that the read of WL_i would be an accurate read. For WL_i+1 in the right "Bias" column, the written word lines WL0 to WL_i will all receive VREAD and be conducting; VREAD_PARTIAL is only applied to unwritten word lines WL_i+2 to WL64, so they will also be conducting; and the sensing voltage VCG_R on WL_i+1 will accurate indicate that it has not been written.

The use of the lower VREAD_PARTIAL can help to reduce the disturb accumulated on drain side erased word lines, thereby reducing bit error rates. This is shown in the plot of FIG. 14, that is based on device data and where the horizontal axis is the number of read cycles and the vertical axis is an indication of bit error rates along a word line. The behavior of a fully written block is shown at 1401 and for a partially written block that uses the full VREAD for all word line at 1403. In this example, VREAD is on the order of several volts. The effect of reducing VREAD_PARTIAL incrementally by about 7%, 10%, and 20% relative to VREAD is respectively shown at 1405, 1407, and 1409. As shown on the plot, reducing VREAD_PARTIAL by around 20% relative to VREAD will significantly reduce disturb on partially written blocks to a level similar to disturb on wholly written blocks.

In the embodiment illustrated with respect to FIG. 13, all of the word lines on the drain of the selected word line are set to VREAD_PARTIAL. In other cases, it may be more practical to set only some of these word lines at the lower level; for example, if word line decoding uses a zone structure, where word lines are grouped into contiguous sets, it may make sense to apply VREAD_PARTIAL to only the word lines of entire zones that fall on the drain side of the currently selected word line. As to the level used for VREAD_PARTIAL relative to the standard VREAD, this can be a fixed offset or can depend on the device's age, number of program/erase cycles the block has seen, number of word lines, or other factors.

The use of the reduced VREAD_PARTIAL when searching for the last written page can be used for a binary search as well as other algorithms. For instance, the search can be made by progressing from the source end to drain end, skipping word lines along the way where, as alluded to above, the result of reading a written word line with the lowered VREAD_PARTIAL can be used as part of an intelligent algorithm to decide how many word lines to skip.

The Last Written Page Detection (LWPD) can be sped up by skipping some number of word lines, but still having some or all of the drain side word lines at a lower bias VREAD_PARTIAL. Due to the NAND structure, the number of "1"s in the pattern will be a logical "AND" of all the word lines at VREAD_PARTIAL. As the number of word lines at VREAD_PARTIAL decreases, the number of "1's" decreases; and as level of VREAD_PARTIAL decreases, the number of "1"s decreases. So measuring the number of "1"s at a given voltage can provide an estimate of the distance to the true boundary. Consequently, an exemplary scan algorithm can base the number of skipped word lines on the number of "1" bits read after the scan: if "1" bits are less than a criterion, then the presumption is that it is far from the boundary and the algorithm can do a big step for skipped number of word lines; otherwise, a smaller step of fewer word lines is used. Depending upon the VREAD_PARTIAL bias, the criteria for skipping WLs can be set.

Figure 15:
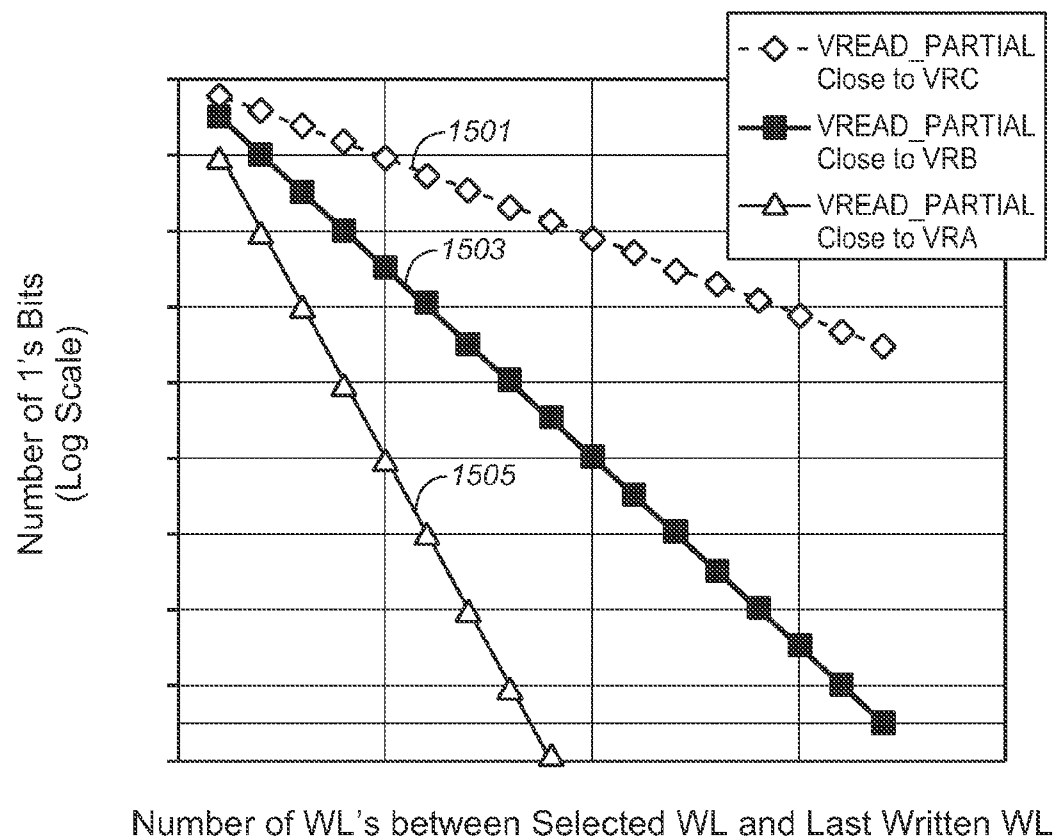
FIG. 15 graphically represents the relationship between the number of "1" bits and the number of word lines between a selected and the last written word line for different VREAD_PARTIAL levels.

This is illustrated in the plot of FIG. 15, where horizontal axis is the number of word lines between the selected word line and the last written word line, and the vertical axis is the expected number of "1" bits. This example is for a 2 bit per cell embodiment, where the states are labelled Er, A, B, C in order of increasing thresholds. The voltage VRC is used to distinguish between the B and C states and is shown at 1501; the voltage VRB is used to distinguish between A and B states and is shown at 1503; and the VRA voltage is used to distinguish between the Er and A states and is shown at 1505.

Figure 16:
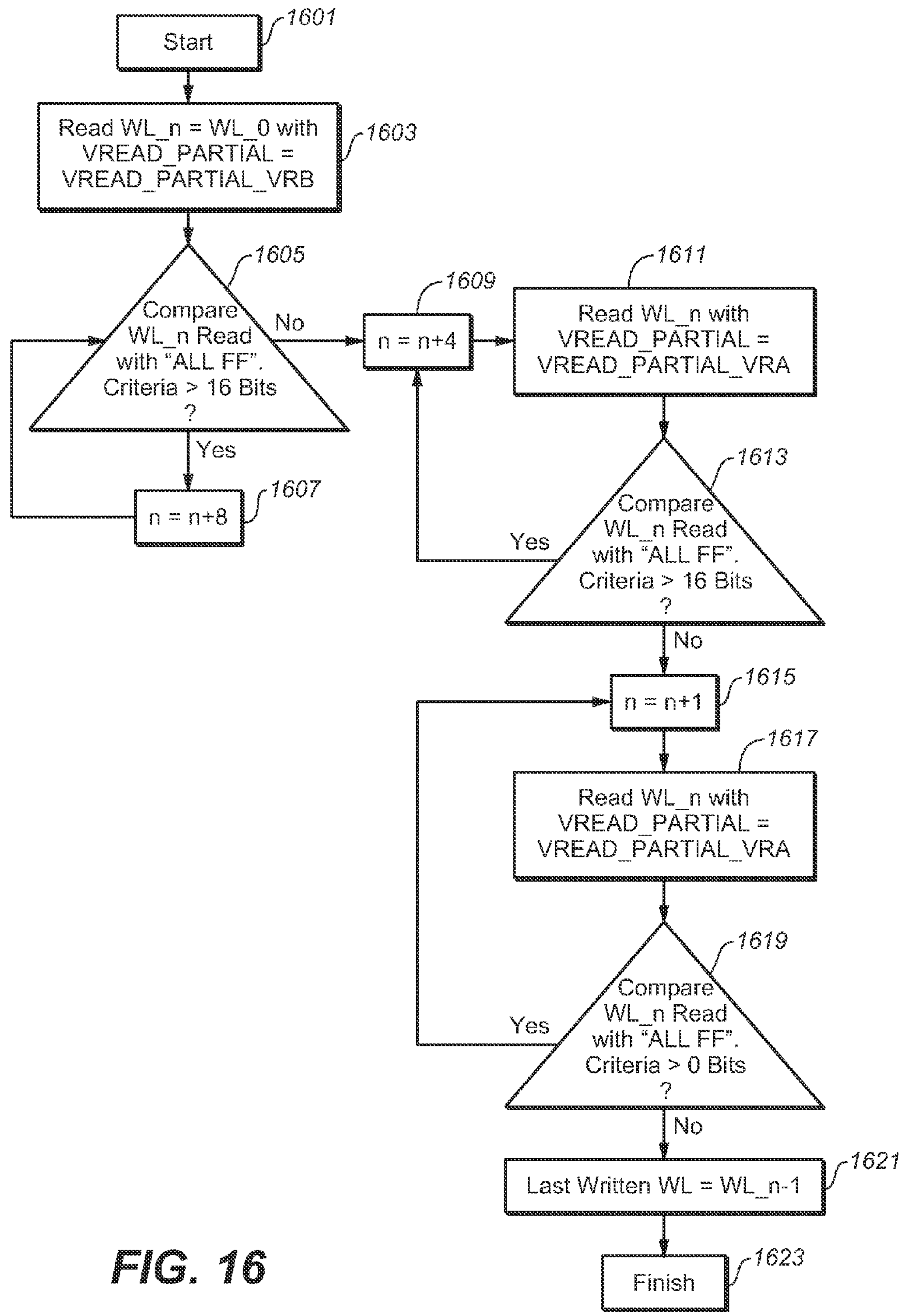
FIG. 16 is an example of an algorithm that intelligently decides how may word lines to skip between reads when determining a last written word line.

Say, for example, the algorithm starts with VREAD_PARTIAL close to VRB (i.e., all cells with B-state/C-state on drain side WLs will cut-off the NAND string and hence, will make threshold voltages on selected word lines appear high, i.e. as a 0-bit) due to an increase in NAND string resistances. If the algorithm uses can a criterion of, say, 16 bits, then it can step ~8 word lines without having to worry about over-stepping past the last written word line. Then, switching to a VREAD_PARTIAL to close to VRA, it can step ~4 word lines until the time criteria of 16 bits is reached. Finally, it can switch to 1 word line at a time until getting an ALL FF result. FIG. 16 illustrates such an algorithm.

The flow of FIG. 16 starts at 1601 and at 1603 WL0 is read using a VREAD_PARTIAL level close to VRB. At 1605 it is determined whether the read at 1603 meets the criterion of ALL FF values being greater than, in this example, 16 bits. If yes, the selected word line value is incremented at 1607 by 8 and the process loops back to 1605. If the criterion is not met, the word line value is only incremented by 4 at 1609 and the flow goes to 1611. The selected word line is then read at 1613, where the VREAD_PARTIAL level is dropped down to near the VRA level. The read result is then compared to the criterion at 1613: if passes, n incremented by 4 at 1609 before looping back to 1611; if "No", the count is incremented by 1 at 1615 before being read at 1617 checked against the criterion at 1619. If 1619 gives a "Yes", the process loops back to 1615; if "No", the last written word line is WL_n−1 (1621), at which point the flow ends (1623). This algorithm can speeds up the LWPD search, while only subjecting the drain side word lines to VREAD_PARTIAL, reducing disturb issues on partially written blocks. A number of variations on this algorithm can be used, including backing up in case of over-shoot or a hybridized binary search.

Figure 17:
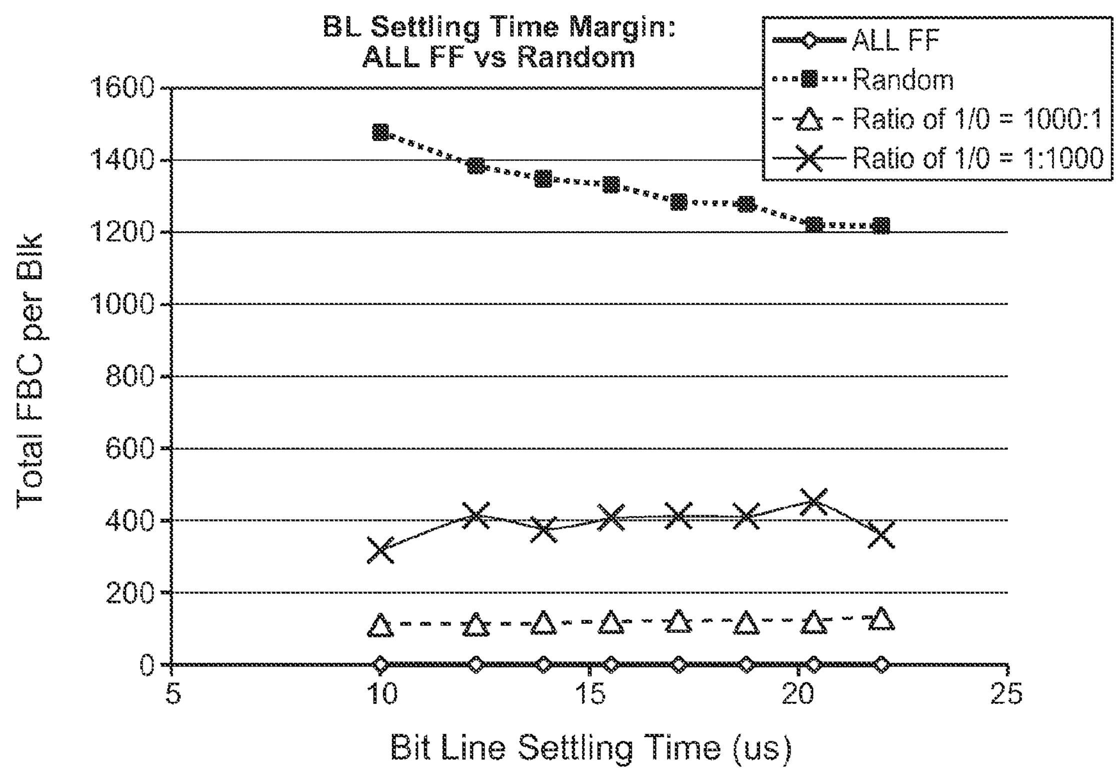
FIG. 17 illustrates differences in bit line settling times for different data patterns.

For any of the LWPD algorithms, whether using a reduced VREAD_PARTIAL or not, the process can be accelerated by performing the ALL-FF detection with smaller bit line settling times. In a sensing operation, before the sensing voltage is applied to the selected word line, it is usual to settle some voltage level on the bit lines in order accurately read the page. As a LWPD need not read the data as accurately, this is one reason why the settling time can be shorted. Another reason is that the bit lines should also settle more quickly in a partially written block since all of the unwritten bit lines will have the same data (namely, all in an erased state), reducing the effect of differing states on different bit lines has on how quickly settling can occur. This effect is illustrated in FIG. 17. In FIG. 17, the number of incorrect bits (FBC) is plotted against bit line settling times.

These various aspects can all help to accelerate the LWPD process so that a process that previously would need to involve the controller can now be done by the memory chip itself. In such a last page to be written search, it is not known up front which pages are not written, but many these aspects described above can also be applied to reading partially written blocks in a data read operation when there is prior knowledge of which pages are unwritten.

When performing a read to extract a page of data along a word line of NAND memory, the non-selected word lines are biased so that they will conduct independently of the stored data. For the standard VREAD, this needs to be a level above the threshold of the highest states. If the memory system knows that a block is only partially written, and knows which of the word lines are unwritten, a lower VREAD_PARTIAL can be used on some or all of these unwritten word lines, reducing their disturb level while still allowing them to conduct. This lower VREAD_PARTIAL can be used on all of the unwritten word lines, even where these are not written sequentially, or a subset, such as when word lines are organized as zones and only fully unwritten zones use the lowered value.

Figure 18:
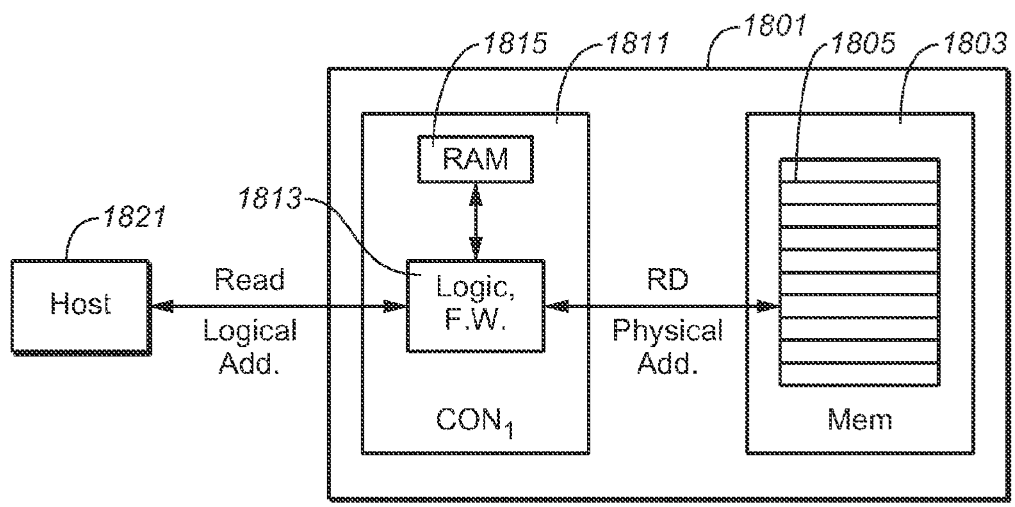
FIG. 18 is a block diagram to help illustrate a modified read operation using a reduced VPASS on unwritten word lines.

FIG. 18 is an example of a simplified box diagram to illustrate the situation. A host 1821 sends a read command the memory system 1801, where the memory system could a memory card, embedded memory system, solid state drive (SSD) and so on. The memory system 1801 is here taken to be formed of a controller 1811 and a number of memory chips, only one of which is shown at 1803; and on the memory chip 1803, only an array 1805 divided into multiple blocks is explicitly represented. A host typically bases a read command on a logical address that the controller the controller then converts into a corresponding physical address for where the data is stored on the memory circuit. The logical address is received at the controller 1811, where the logic circuitry/firmware 1813 use conversion information, typically stored in RAM 1815, to obtain the physical address used when passing the read command on to the memory circuit. Based on the physical address, the logic circuitry/firmware 1813 can also determine whether the corresponding block is only partially written, where this could also be done based on a list stored in RAM 1815. Alternately, the memory chip itself could make the determination that the read command is for a partially written block.

In one implementation, when sending the read command from the controller 1811 to the memory 1803, the logic circuitry/firmware 1813 can send an additional prefix command with, say, 1 byte address to the NAND memory 1803 indicating where the written/unwritten word line boundary is. Once the boundary in known by the NAND, it can setup the voltages on the word lines beyond the written area accordingly. Similarly, for multi-plane operation, a prefix can be issued separately for each plane, as the open block may be written up to a different page (n−1) on different planes. The word line/page information can be used to approximate the boundary if a group of word lines are part of the same driver circuit. In this case the exact boundary need not be used, but set at the edge of the zone.

In the preceding, the read was initiated by the host, but this technique can also be applied to reads originating on the memory circuit itself, such as arise is data relocation or data scrub operations. The read can be for user data or for system data reads, where the latter more typically have partially written blocks (and often more sensitive data) due to its nature.

Conclusion

The foregoing detailed description has been presented for purposes of illustration and description. It is not intended to be exhaustive or to limit the above to the precise form disclosed. Many modifications and variations are possible in light of the above teaching. The described embodiments were chosen in order to explain the principles involved and its practical application, to thereby enable others to best utilize the various embodiments and with various modifications as are suited to the particular use contemplated. It is intended that the scope be defined by the claims appended hereto.

The invention claimed is:

1. A method, comprising:

performing a first sense operation on a particular word line of a block comprising a plurality of word lines having a sequential program ordering, wherein the first sense operation indicates that memory cells coupled to the particular word line are programmed, and comprises:

applying a first non-selected word line voltage to word lines between the particular word line and a first end of the block, the first non-selected word line voltage configured to cause programmed memory cells to conduct, and applying a second non-selected word line voltage to word lines between the particular word line and a second end of the block, the second non-selected word line voltage configured to cause erased memory cells to conduct, wherein the second non-selected word line voltage is less than the first non-selected word line voltage;

selecting a subsequent word line for a second sense operation in response to the first sense operation indicating that memory cells coupled to the particular word line are programmed, the subsequent word line selected to follow the particular word line in the sequential program ordering; and determining that the particular word line is a last word line programmed in the sequential program ordering in response to the second sense operation indicating that memory cells coupled to the subsequent word line.

2. The method of claim 1, wherein the second sense operation comprises:

applying the first non-selected voltage to word lines that precede the subsequent word line in the sequential program ordering, and applying the second non-selected voltage to the subsequent word line and to word lines ordered after the subsequent word line in the sequential program ordering.

3. The method of claim 1, wherein memory cells of the block are arranged within respective memory strings, and wherein the first sense operation comprises determining that memory cells coupled to the particular word line are programmed in response to determining that sense current is substantially blocked on one or more of the memory strings during the first sense operation.

4. The method of claim 1, wherein memory cells of the block are connected to one or more bit lines, and wherein the second sense operation comprises:

determining that the memory cells coupled to the subsequent word line of the block are erased in response to sensing a current on one or more of the bit lines.

5. The method of claim 1, further comprising:

performing an initial sense operation on an initial word line of the block; and skipping one or more word lines to select the particular word line for the first sense operation in response to determining that memory cells coupled to the initial word line are programmed, wherein a number of word lines skipped in selecting the particular word line for the first sense operation is based on a number of memory cells associated with the initial word line determined to be conducting in the initial sense operation.

6. The method of claim 5, further comprising:

skipping a first number of word lines when the number of memory cells determined to be conducting is greater than a first value, and skipping a second number of word lines when the number of memory cells determined to be conducting is less than or equal to the first value, the second number being less than the first number.

7. The method of claim 1, wherein memory cells of the block are arranged within respective memory strings, and wherein the first non-selected word line voltage is configured to cause memory cells in any of a plurality of programmed states to conduct, the method further comprising:

performing an initial sense operation, comprising determining a number of the memory strings that are conductive when the first non-selected word line voltage is applied to word lines between an initial word line and the first end of the block and a third non-selected word line voltage is applied to word lines between the initial word line and the second end of the block, the third non-selected word line voltage configured to cause memory cells in one of an erased state and one or more of the programmed states to conduct and to cause memory cells in programmed states other than the one or more programmed memory states to be substantially non-conducting; and selecting the particular word line for the first sense operation on the block based on the determined number.

8. The method of claim 1, wherein a plurality of the memory cells of the block are connected in a NAND string, each memory cell in the NAND string having a control gate coupled to a respective word line of the block, wherein the second sense operation comprises:

applying the first non-selected word line voltage to a set of the word lines of the block, the set including word lines between the subsequent word line and the first end of the block; and determining that the subsequent word line is coupled to an erased memory cell in response to sensing a current on the NAND string after a settling time for the second sense operation, wherein the settling time for the second sense operation is shorter than a settling time for a sense operation that comprises applying the first non-selected word line voltage to more word lines than a number of word lines included in the set.

9. The method of claim 1, wherein the memory cells of the block are formed within one or more of a two-dimensional array and a monolithic three-dimensional semiconductor memory device with the memory cells being arranged in multiple physical levels above a silicon substrate.

10. The method of claim 1, wherein two or more of the memory cells of the block are connected in series, the two or more memory cells including a memory cell coupled to the particular word line and a memory cell coupled to the subsequent word line, wherein the first sense operation comprises:

applying the second non-selected word line voltage to the particular word line during a first sense period, applying a sense voltage potential to the two or more memory cells during the first sense period, and determining that memory cells coupled to the particular word line are programmed based on current sensed through the two or more memory cells during the first sense period, and wherein the second sense operation comprises:

applying the second non-selected word line voltage to the subsequent word line during a second sense period, applying the first non-selected word line voltage to the particular word line during the second sense period, applying the sense voltage potential to the two or more memory cells during the second sense period, and determining that memory cells coupled to the subsequent word line are erased based on current sensed through the two or more memory cells during the second sense period.

11. A memory device, comprising:

sense circuitry coupled to an array of memory cells, each memory cell coupled to one of a plurality of bit lines and one of a plurality of word lines, the sense circuitry configured for identifying a first erased word line in a sequential programming order for the word lines from a source end of the array to a drain end of the array by:

sensing that memory cells coupled to a designated one of the word lines are programmed while word lines between the designated word line and the drain end of the array are set to a low non-select voltage level and word lines between the designated word line and the source end of the array are set to a high non-select voltage level, wherein the high non-select voltage level is configured to cause erased memory cells of the array and programmed memory cells of the array to conduct, and wherein the low non-select voltage level is configured to cause the erased memory cells of the array to conduct and programmed memory cells of the array to be substantially non-conducting;

selecting a word line that follows the designated word line in the sequential programming order for the word lines in response to sensing that memory cells coupled to the designated word line are programmed; and determining that the selected word line corresponds to the first erased word line in the sequential programming order for the word lines in response to sensing that memory cells coupled to the selected word line are erased while word lines between the selected word line and the drain end of the array are set to the low non-select voltage level and word lines between the selected word line and the source end of the array are set to the high non-select voltage level.

12. The memory device of claim 11, wherein:

the memory cells comprise non-volatile memory cells, and the array of memory cells comprises one or more of a two-dimensional array and a three-dimensional array.

13. The memory device of claim 11, wherein:

the memory cells comprise multi-state memory cells capable of being in one of an erased state and one of a plurality of programmed states, the low non-select voltage level is configured to cause memory cells in the erased state to conduct and to cause such that memory cells programmed to any one of the plurality of programmed states to be substantially non-conducting, and the high non-select voltage level is configured to cause memory cells in any of the erased state and the plurality of programmed states to conduct.

14. The memory device of claim 11, wherein the sense circuitry is configured to determine that the memory cells coupled to the selected word line are erased in response to sensing a voltage on one or more of the bit lines during a first sense time, and wherein the first sense time is less than a read sense time associated with a read operation on the array of memory cells.

15. A memory system, comprising:

a series of memory cells; and a controller configured to identify a first erased memory cell in the series of memory cells by performing a plurality of sense operations, wherein each sense operation is performed on a selected memory cell of the series to determine whether the selected memory cell of the series is erased, and comprises:

applying a first voltage potential to control gates of one or more memory cells of the series ordered before the selected memory cell in the series, the first voltage potential configured to cause programmed memory cells of the series to be conductive during the sense operation, and applying a second voltage potential to a control gate of the selected memory cell of the series, wherein the second voltage potential is lower than the first voltage potential and is configured to cause erased memory cells of the series to be conductive during the sense operation and to cause the programmed memory cells of the series to be substantially nonconductive during the sense operation, wherein the controller determines that a particular memory cell is the first erased memory cell in the series in response to:

performing a first sense operation of the plurality of sense operations on a first memory cell of the series;

selecting the particular memory cell for a second sense operation of the plurality of sense operations in response to the first sense operation indicating that the first memory cell is programmed, wherein the particular memory cell is selected to follow the first memory cell in the series of memory cells; and determining that the particular memory cell is the first erased memory cell in the series in response to the second sense operation of the plurality of sense operations indicating that the particular memory cell is erased.

16. The memory system of claim 15, wherein the memory cells of the series comprise non-volatile memory cells arranged in a two-dimensional array, wherein each of the memory cells of the series comprises a charge storage medium.

17. The memory system of claim 15, wherein the memory cells of the series comprise non-volatile memory cells arranged in a three-dimensional array.

18. The memory system of claim 15, wherein the memory cells of the series comprise multi-state memory cells, each multi-state memory cell capable of being in one of an erased state and one of a plurality of programmed states, wherein:

each of the sense operation of the plurality of sense operations indicates whether the selected memory cell of the series is in the erased state or one of the plurality of programmed states, and the first voltage potential is configured to cause memory cells of the series in any of the plurality of programmed states to conduct.

19. The memory system of claim 15, wherein each sense operation of the plurality of sense operations comprises sensing a voltage potential on the series of memory cells within a respective sense time period, and wherein the sense time period is less than a read time period associated with a read operation on the series of memory cells.

20. The memory system of claim 15, wherein:

a source end of the series is coupled to a source node and a drain end of the series is coupled to a drain node; and the controller is configured to program memory cells of the series sequentially from the source end of the series to the drain end of the series.

21. The memory system of claim 15, wherein each sense operation of the plurality of sense operations further comprises applying the second voltage potential to control gates of one or more memory cells of the series following the selected memory cell in the series.

22. The memory system of claim 15, wherein the controller is further configured to:

program memory cells of the series from a first end of the series of memory cells to a second end of the series of memory cells;

select an initial memory cell of the series for an initial sense operation of the plurality of sense operations; and select the first memory cell of the series for the first sense operation of the plurality of sense operations in response to the initial sense operation indicating that the initial memory cell of the series is programmed, wherein the first memory cell is selected from memory cells of the series between the initial memory cell of the series and the second end of the series.

23. The memory system of claim 15, wherein:

each sense operation further comprises sensing current through the series of memory cells after a first settling time; and the controller is further configured to perform a read operation to read a designated memory cell of the series, wherein performing the read operation comprises:

applying the first voltage potential to control gates of one or more of the memory cells of the series; and sensing current through the series of memory cells after a second settling time, the second settling time longer than the first settling time.

24. The memory device of claim 11, wherein the sense circuitry is further configured to perform a plurality of read operations on bit lines of the array, wherein an initial one of the read operations comprises:

sensing bit lines of the array while word lines from a starting point within the word lines to a source end of the array are set to a first partial non-select voltage level, wherein the first partial non-select voltage level is between the low non-select voltage level and the high non-select voltage level, and is configured to cause memory cells in one of an erased state and first programmed state to conduct and to cause memory cells in one or more second programmed states to be substantially non-conducting; and advancing the starting point for a next read operation by a determined amount of word lines, the determined amount corresponding to a number of bit lines sensed as being conductive in the initial read operation.

25. An apparatus, comprising:

memory logic configured to identify a first erased word line of a memory block comprising a plurality of word lines corresponding to a program order, the memory logic configured to implement a plurality of read iterations on the memory block at respective word line offsets within the program order, wherein performing a read iteration at a current word line offset comprises:

sensing bit lines of the memory block by use of sense circuitry to determine a count of bit lines that are non-conducting while word lines preceding the current word line offset are set to a high read voltage potential, and word lines following the current word line offset are set to a partial read voltage potential, wherein the high read voltage potential is configured to cause memory cells of the bit lines to conduct, and wherein the partial read voltage potential is configured to cause memory cells of the bit lines that are in an erased state to conduct and to cause memory cells of the bit lines that are in one or more of a plurality of programmed states to be substantially non-conducting;

continuing the plurality of read iterations after the current read iteration in response to the determined count being greater than zero, the continuing comprising determining a next word line offset for a next read iteration of the plurality of read iterations by incrementing the current word line offset in the program order; and terminating the plurality of read iterations in response to the determined count being equal to zero, the terminating comprising determining that the current word line offset corresponds to the first erased word line of the memory block based on a read iteration preceding the current read iteration in the plurality of read iterations.

26. The apparatus of claim 25, wherein continuing the plurality of read iterations further comprises:

incrementing the current word line offset in the program order by a first number of word lines in the program order in response to the determined count satisfying a first threshold; and incrementing the current word line offset in the program order by a second number of word lines in the program order in response to the determined count failing to satisfy the first threshold, the second number less than the first number.

27. The apparatus of claim 25, wherein continuing the plurality of read iterations further comprises:

decreasing the partial read voltage potential for the next read iteration such that performing the next read iteration at the next word line offset comprises sensing the bit lines of the memory block while word lines proceeding the next word line offset are set to the high voltage potential, and word lines following the next word line offset are set to the decreased partial read voltage potential, wherein the decreased partial read voltage potential is configured to cause memory cells of the bit lines that are in an erased state to conduct and to cause memory cells of the bit lines that are in any of the plurality of programmed states to be substantially non-conducting.

28. A system, comprising:

means for performing a first sense operation on a particular word line of a block comprising a plurality of word lines having a sequential program ordering, wherein the first sense operation indicates that memory cells coupled to the particular word line are programmed, and comprises:

applying a first non-selected word line voltage to word lines between the particular word line and a first end of the block, the first non-selected word line voltage configured to cause programmed memory cells to conduct, and applying a second non-selected word line voltage to word lines between the particular word line and a second end of the block, the second non-selected word line voltage configured to cause erased memory cells to conduct, wherein the second non-selected word line voltage is less than the first non-selected word line voltage;

means for selecting a subsequent word line for a second sense operation in response to the first sense operation indicating that memory cells coupled to the particular word line are programmed, the subsequent word line selected to follow the particular word line in the sequential program ordering; and means for determining that the particular word line is a last word line programmed in the sequential program ordering in response to the second sense operation indicating that memory cells coupled to the subsequent word line are erased.

* * * * *